(12) United States Patent
Kawamura

(10) Patent No.: US 7,369,392 B2
(45) Date of Patent: May 6, 2008

(54) CIRCUIT FOR PREVENTING SIMULTANEOUS ON OPERATIONS

(75) Inventor: Yoshihiro Kawamura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 310 days.

(21) Appl. No.: 11/322,336

(22) Filed: Jan. 3, 2006

(65) Prior Publication Data

US 2006/0158039 A1    Jul. 20, 2006

(30) Foreign Application Priority Data

Jan. 14, 2005    (JP) ............................ 2005-007026

(51) Int. Cl.
*H01H 47/00*    (2006.01)
(52) U.S. Cl. .................................... 361/167
(58) Field of Classification Search ................ 361/137, 361/100–102; 307/307, 112, 116, 135, 125, 307/132 E
See application file for complete search history.

(56) References Cited

U.S. PATENT DOCUMENTS 4,158,866 A  *  6/1979  Baker ........................... 361/86

FOREIGN PATENT DOCUMENTS

JP    2002-75622    3/2002

* cited by examiner

*Primary Examiner*—Michael Sherry
*Assistant Examiner*—Nicholas Ieva
(74) *Attorney, Agent, or Firm*—Kratz, Quintos & Hanson, LLP

(57) ABSTRACT

Providing a circuit for preventing simultaneous ON operations at a relay drive apparatus, which can prevent the simultaneous ON operations securely, the circuit includes a first diode, a second diode, a first transistor connected through the first diode with a first drive unit for controlling ON/OFF operation, a second transistor connected through the second diode with the second drive unit for controlling ON/OFF operation, a first junction point of the first resistor and the first drive unit, a second junction point of the second resistor and the second drive unit, a third junction point of the first diode and the first transistor, a fourth junction point of the second diode and the second transistor, a third diode connected with the second junction point and the third junction point, and a fourth diode connected with the first junction point and the fourth junction point.

4 Claims, 3 Drawing Sheets

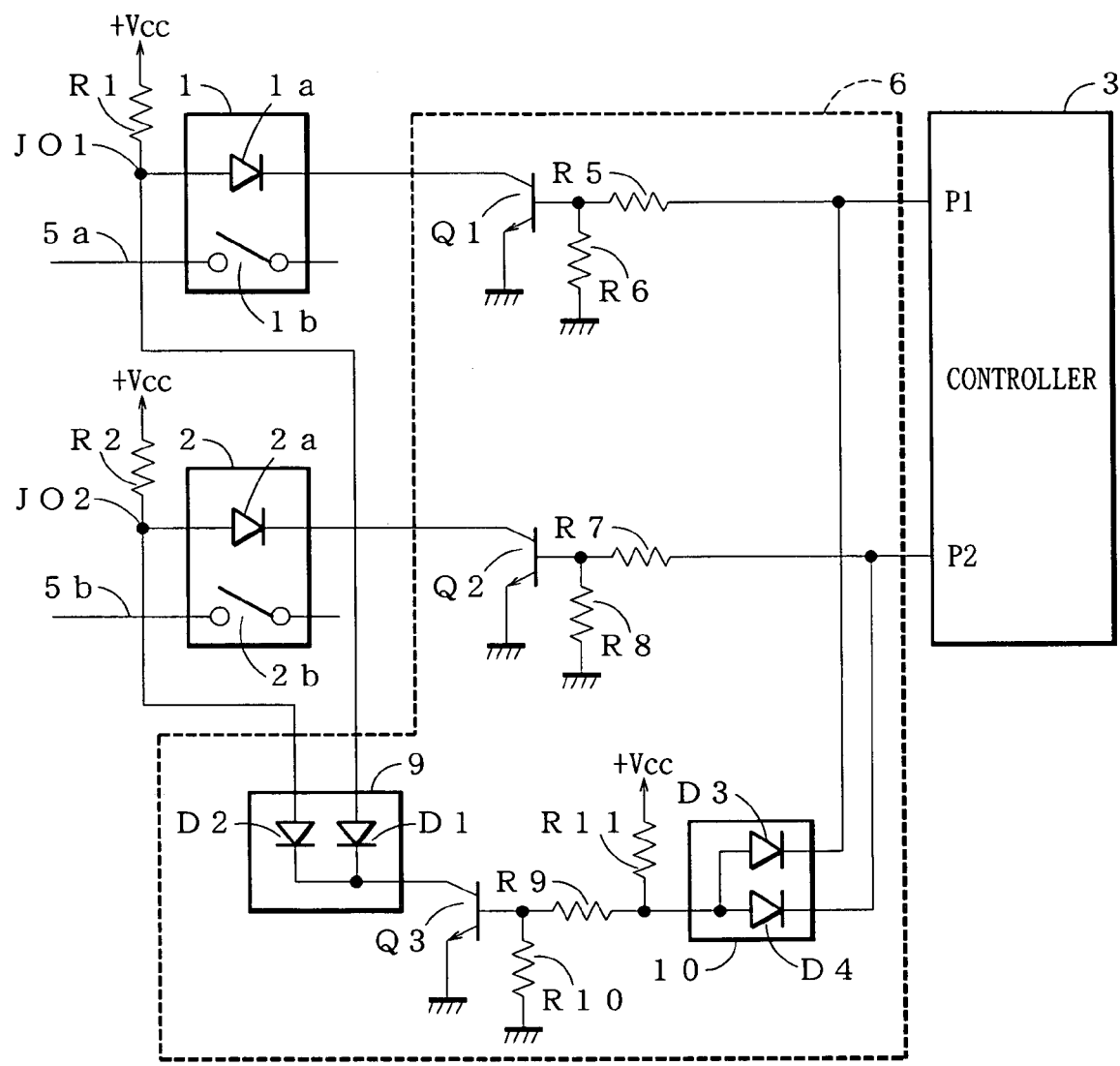
F I G. 4 ured and works as mentioned above, is disclosed in Japan Patent Application Laid Open 2002-75622.
CIRCUIT FOR PREVENTING SIMULTANEOUS ON OPERATIONS The priority application Number Japan Patent Application 2005-007026 upon which this patent application is based is hereby incorporated by reference.

BACKGROUND OF THE INVENTION

1. Field of the Invention

This invention relates to a circuit for preventing simultaneous ON operations at a relay drive apparatus.

2. Description of the Related Art

As a circuit for preventing simultaneous ON operations at a relay drive apparatus, a usual inhibit circuit by a logic IC is applied.

FIG. 5 is a circuit diagram of the circuit for preventing simultaneous ON operations at the usual relay drive apparatus. As shown in FIG. 5, in a relay drive circuit, an inhibit circuit 4 as a circuit for preventing simultaneous ON operations is connected between two semiconductor relays 1, 2 and control signal output terminals P1, P2 of a controller 3 having a microcomputer for controlling ON/OFF operation of the semiconductor relays 1, 2. The control signal output terminals P1, P2 output respectively control signals, one of those is "H" level and the other of those is "L" level.

The semiconductor relay 1 includes a photo-coupler having a light emitting diode 1a connected through a first resistor R1 with +Vcc power supply and a semiconductor switch element 1b structured by a MOS-FET turning ON/OFF to be controlled by an output from the photo-coupler. The semiconductor switch element 1b is connected with one signal line (first signal line) 5a of two signal lines 5a, 5b to be alternatively turned ON for danger by simultaneous ON operations.

The semiconductor relay 2 includes a photo-coupler having a light emitting diode 2a connected through a second resistor R2 with +Vcc power supply and a semiconductor switch element 2b structured by a MOS-FET turning ON/OFF to be controlled by an output from the photo-coupler. The semiconductor switch element 2b is connected with the other signal line (second signal line) 5b of two signal lines 5a, 5b to be alternatively turned ON for danger by simultaneous ON operations.

The inhibit circuit 4 includes four NAND gate elements with two input terminal 4a, 4b, 4c, 4d. Two input terminals of the NAND gate element 4a are connected with the control signal output terminal P2, and an output terminal thereof is connected with one of two input terminals of the NAND gate element 4b. The other of two input terminals of the NAND gate element 4b is connected with the control signal output terminal P1, and an output terminal thereof is connected with the light emitting diode 1a of the semiconductor relay 1. Two input terminals of the NAND gate element 4c are connected with the control signal output terminal P1, and an output terminal thereof is connected with one of two input terminals of the NAND gate element 4d. The other of two input terminals of the NAND gate element 4d is connected with the control signal output terminal P2, and an output terminal thereof is connected with the light emitting diode 2a of the semiconductor relay 2.

In the above structure, when the control signal output terminal P1 of the controller 3 is "H" level and the control signal output terminal P2 is "L" level in normal operations, an output terminal of the NAND gate element 4b of the inhibit circuit 4 accordingly becomes "L" level, and an output terminal of the NAND gate element 4d becomes "H" level. Thereby, the light emitting diode 1a of the semiconductor relay 1 is turned on a light and the semiconductor switch element 1b turns ON. The light emitting diode 2a of the semiconductor relay 2 is OFF and the semiconductor switch element 2b is OFF.

Oppositely, when the control signal output terminal P1 of the controller 3 is "L" level and the control signal output terminal P2 is "H" level, the output terminal of the NAND gate element 4b of the inhibit circuit 4 accordingly becomes "H" level, and the output terminal of the NAND gate element 4d becomes "L" level. Thereby, the light emitting diode 2a of the semiconductor relay 2 is turned on a light and the semiconductor switch element 2b turns ON. The light emitting diode 1a of the semiconductor relay 1 is OFF and the semiconductor switch element 1b is OFF.

When the both control signal output terminals P1, P2 become "H" level because of a malfunction or stampede of the microcomputer as an abnormal operating condition, the both output terminals of the NAND gate elements 4b, 4d become "H" level. Thereby, the both light emitting diodes 1a, 2a of the semiconductor relays 1, 2 are OFF, and the both semiconductor switch elements 1b, 2b become OFF. Thus, on the abnormal operating condition, the semiconductor switch elements 1b, 2b are prevented from simultaneous ON operations.

A circuit for preventing ON operations, which is structured and works as mentioned above, is disclosed in Japan Patent Application Laid Open 2002-75622.

SUMMARY OF THE INVENTION

Objects to be Solved

The usual circuit as mentioned above has following problems:

1) When the microcomputer stampedes or malfunctions, simultaneous ON operations of two outputs can be prevented securely. However, when the inhibit circuit 4 malfunctions (for example, latchup occurs), output terminals of two NAND gate elements 4b, 4d become "L" level together by themselves, the both light emitting diodes 1a, 2a are turned on a light, and the both semiconductor switch elements 1b, 2b turn ON.

2) The inhibit circuit 4 is structured with logic ICs, so that it is weak for noise and voltage change of power supply, and weak to malfunction by strong noise by static electricity or unexpected input voltage.

3) Cost of ICs structuring the inhibit circuit 4 is expensive.

To overcome the above problem, an object of the present invention is to provide a circuit for preventing simultaneous ON operations at a relay drive apparatus, which can prevent the simultaneous ON operations securely by low cost.

How to Attain the Object of the Present Invention

In order to attain the object of the present invention, a circuit for preventing simultaneous ON operations according to an aspect of the present invention is characterized at a relay drive apparatus, which includes a first relay having a first drive unit receiving drive current through a first resistor from a power supply and a first switch device connected with a first signal line to be driven by the first drive unit, a second relay having a second drive unit receiving drive current through a second resistor from said power supply and a second switch device connected with a second signal line to be driven by the second drive unit, and a controller having a first control signal output terminal for outputting a control signal to control the first drive unit and a second control signal output terminal for outputting a control signal to control the second drive unit in that includes a first diode, a second diode, a first transistor connected through the first diode with the first drive unit for controlling ON/OFF operation by the control signal derived from the first control signal output terminal of the controller, a second transistor connected through the second diode with the second drive unit for controlling ON/OFF operation by the control signal derived from the second control signal output terminal of the controller, a first junction point of the first resistor and the first drive unit, a second junction point of the second resistor and the second drive unit, a third junction point of the first diode and the first transistor, a fourth junction point of the second diode and the second transistor, a third diode, an anode of which is connected to the second junction point and a cathode of which is connected to the third junction point, and a fourth diode, an anode of which is connected to the first junction point and a cathode of which is connected to the fourth junction point.

A circuit for preventing simultaneous ON operations according to another aspect of the present invention is characterized at a relay drive apparatus, which includes a first relay having a first drive unit receiving drive current through a first resistor from a power supply and a first switch device connected with a first signal line to be driven by the first drive unit, a second relay having a second drive unit receiving drive current through a second resistor from said power supply and a second switch device connected with a second signal line to be driven by the second drive unit, and a controller having a first control signal output terminal for outputting a control signal to control the first drive unit and a second control signal output terminal for outputting a control signal to control the second drive unit in that includes a first diode being connected between the first resistor and the first drive unit, a second diode being connected between the second resistor and the second drive unit, a first transistor being connected with the first drive unit for controlling ON/OFF operation by the control signal derived from the first control signal output terminal of the controller, a second transistor being connected with the second drive unit for controlling ON/OFF operation by the control signal derived from the second control signal output terminal of the controller, a first junction point of the first resistor and the first drive unit, a second junction point of the second resistor and the second drive unit, a fifth junction point of the first drive unit and the first transistor, a sixth junction point of the second drive unit and the second transistor, a third diode, an anode of which is connected to the second junction point and a cathode of which is connected to the fifth junction point, and a fourth diode, an anode of which is connected to the first junction point and a cathode of which is connected to the sixth junction point.

A circuit for preventing simultaneous ON operations is further characterized in that the first diode and the fourth diode have a same characteristic, and the second diode and the fourth diode have a same characteristic.

A circuit for preventing simultaneous ON operations according to further aspect of the present invention is characterized at a relay drive apparatus, which includes a first relay having a first drive unit receiving drive current through a first resistor from a power supply and a first switch device connected with a first signal line to be driven by the first drive unit, a second relay having a second drive unit receiving drive current through a second resistor from said power supply and a second switch device connected with a second signal line to be driven by the second drive unit, and a controller having a first control signal output terminal for outputting a control signal to control the first drive unit and a second control signal output terminal for outputting a control signal to control the second drive unit in that includes a first diode, a second diode, a first transistor being connected with the first drive unit for controlling ON/OFF operation by the control signal derived from the first control signal output terminal of the controller, a second transistor being connected with the second drive unit for controlling ON/OFF operation by the control signal derived from the second control signal output terminal of the controller, a first junction point of the first resistor and the first drive unit, a second junction point of the second resistor and the second drive unit, a third transistor being connected through the first diode with the first junction point and through the second diode with the second junction point, a third diode being connected between the first control signal output terminal and the third transistor, and a fourth diode being connected between the second control signal output terminal and the third transistor.

EFFECT OF THE INVENTION

According to the above structure, a circuit for preventing simultaneous ON operations, which ON/OFF operation is securely acted and can prevent from turning drive outputs ON simultaneously even if the circuit for preventing simultaneous ON operations malfunctions, can be given. The circuit is built with discrete components, so that immunity against noise caused by static electricity can be improved. It will be low cost compared with a circuit by ICs.

According to the above structure, bad effects caused by dispersion of characteristics of diodes, such as an effect for an ON/OFF control voltage of the first and second transistors caused by dispersion of forward voltage drop of diodes, can be eliminated.

According to the above structure, a circuit for preventing simultaneous ON operations, which acts securely, can be given. Since the circuit is structured with discrete components, the immunity against noise caused by the static electricity is improved, and cost of the circuit is lower than that of the circuit with ICs.

BRIEF DESCRIPTION OF THE DRAWINGS

FIG. 4 is a circuit diagram of a circuit for preventing simultaneous ON operations at the relay drive apparatus of a third embodiment according to the present invention;

The above and other objects and features of this invention will become more apparent from the following description taken in conjunction with the accompanying drawings.

DESCRIPTION OF THE PREFERRED EMBODIMENT

An embodiment according to the present invention will be described with reference to figures.

First Embodiment

Figure 1:
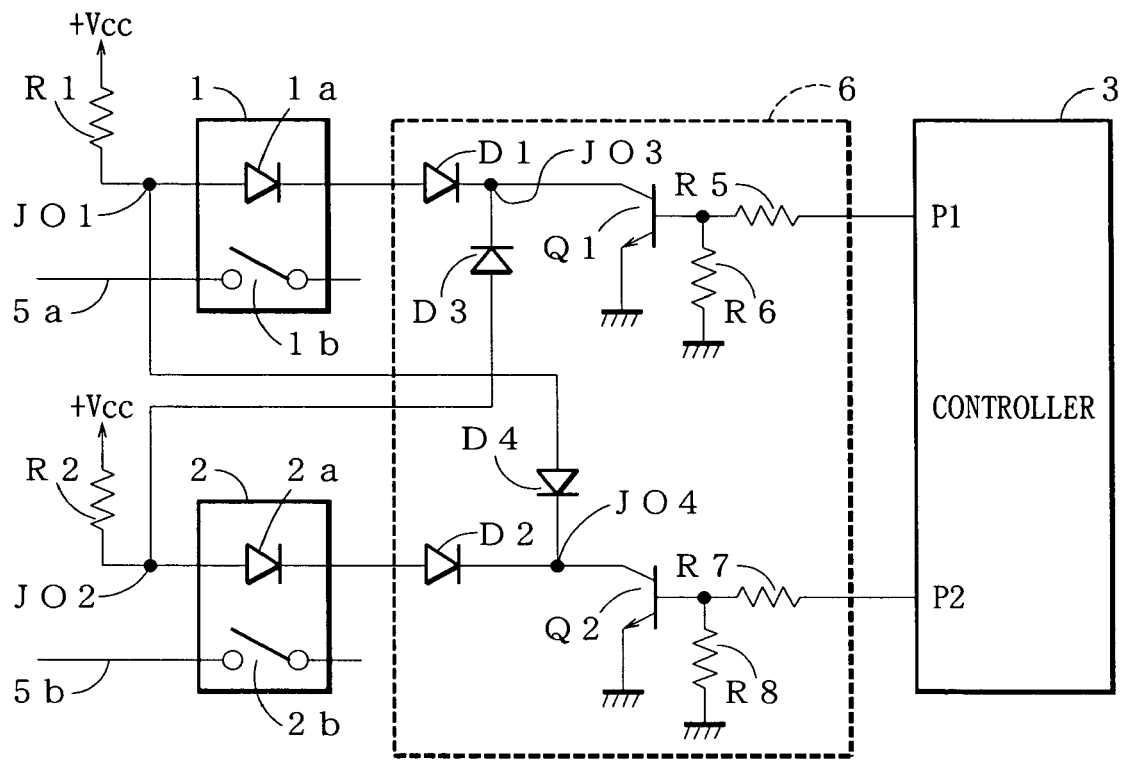
FIG. 1 is a circuit diagram of a circuit for preventing simultaneous ON operations at a relay drive apparatus of a first embodiment according to the present invention.

FIG. 1 is a circuit diagram showing a structure of a circuit for preventing simultaneous ON operations at a relay drive apparatus according to a first embodiment of the present invention.

In FIG. 1, a semiconductor relay drive circuit (relay drive apparatus) includes a controller 3 having two semiconductor relays (first and second relays) 1, 2 and a microcomputer for controlling ON/OFF operation of the semiconductor relays 1, 2. A circuit for preventing simultaneous ON operations 6 is connected between the semiconductor relays 1, 2 and control signal output terminals P1, P2 of the controller 3. The control signal output terminals P1, P2 output respectively control signals; one of those is "H" level and the other of those is "L" level.

The semiconductor relay 1 includes a photo-coupler having a light emitting diode 1a (first drive unit) connected through a first resistor R1 with +Vcc power supply and a semiconductor switch element (first switch device) 1b structured by a MOS-FET turning ON/OFF to be controlled by an output from the photo-coupler. The semiconductor switch element 1b is connected with one signal line (first signal line) 5a of two signal lines (first and second signal lines) 5a, 5b to be alternatively turned ON for danger by simultaneous ON operations.

Figure 2:
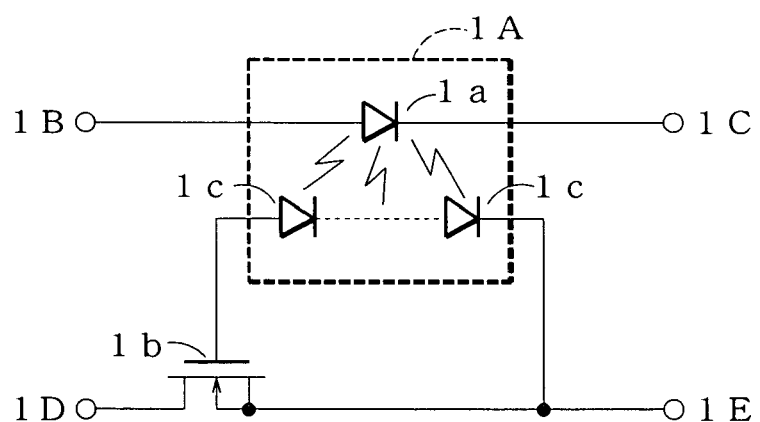
FIG. 2 is a circuit diagram showing a detailed structure of a semiconductor relay of the first embodiment.

In detail, the semiconductor relay 1 is structured with a photo-coupler 1A, which has the light emitting diode 1a connected with an input terminals 1B, 1C and a photo diode 1c receiving light signals emitted by the light emitting diode 1a, and the semiconductor switch element 1b structured by the MOS-FET turning ON/OFF to be controlled by the output from the photo-coupler 1A, as shown in FIG. 2.

Similarly, the semiconductor relay 2 includes a photo-coupler having a light emitting diode (second drive unit) 2a connected through a second resistor R2 with +Vcc power supply and a semiconductor switch element (second switch device) 2b structured by a MOS-FET turning ON/OFF to be controlled by an output from the photo-coupler. The semiconductor switch element 2b is connected with the other signal line (second signal line) 5b of two signal lines 5a, 5b to be alternatively turned ON for danger by simultaneous ON operations. For example, it is assumed that the signal line 5a is a positive electric power line and the signal line 5b is a negative electric power line, and when the semiconductor switch elements 1b, 2b turn ON simultaneously, the power supply is short-circuited. The semiconductor relay 2 has the same structure as the semiconductor relay 1 shown in FIG. 2, and the description of that is omitted.

The circuit for preventing simultaneous ON operations 6 includes first and second transistors Q1, Q2, diodes D1-D4 and resistors R5-R8. The first transistor Q1 is an NPN transistor; a base of which is connected through the resistor R5 with the control signal output terminal P1 of the controller 3 and through the resistor R6 with ground; an emitter of which is grounded; and a collector of which is connected through a third junction point J03 of the first diode D1 and the first transistor Q1, and the first diode D1 with the light emitting diode 1a of the semiconductor relay 1 and connected through the third junction point J03 and the third diode D3 with a second junction point J02 of the resistor R3 and the light emitting diode 2a of the semiconductor relay 2. The first diode D1 is connected in forward direction from a cathode of the light emitting diode 1a to the collector of the first transistor Q1. The third diode D3 is connected in forward direction from the second junction point J02 of the second resistor R2 and the light emitting diode 2a to the collector of the first transistor Q1.

The second transistor Q2 is an NPN transistor; a base of which is connected through the resistor R7 with the control signal output terminal P2 of the controller 3 and through the resistor R8 with ground; an emitter of which is grounded; and a collector of which is connected through a fourth junction point J04 of the second diode D2 and the second transistor Q2, and the second diode D2 with the light emitting diode 2a of the semiconductor relay 2 and connected through the junction point J04 and the fourth diode D4 with a first junction point J01 of the first resistor R1 and the light emitting diode 1a of the semiconductor relay 1. The second diode D2 is connected in forward direction from a cathode of the light emitting diode 2a to the collector of the second transistor Q2. The third diode D3 is connected in forward direction from the first junction point J01 of the first resistor R1 and the light emitting diode 1a to the collector of the second transistor Q2.

In the above structure, when the control signal output terminal P1 of the controller 3 is "H" level and the control signal output terminal P2 of the controller 3 is "L" level in a normal operation, the first transistor Q1 of the circuit for preventing simultaneous ON operations 6 turns ON accordingly. Thereby, the light emitting diode 1a of the semiconductor relay 1 is turned on a light, and the semiconductor switch element 1b is turned ON. The second transistor Q2 is OFF, and the second junction point J02 of the second resistor R2 and the light emitting diode 2a of the semiconductor relay 2 is connected through the third diode D3 and the first transistor Q1 with ground. Therefore, power supply to the light emitting diode 2a is cut off, so that the light emitting diode 2a turns OFF and the semiconductor switch element 2b is turned OFF.

Oppositely, when the control signal output terminal P2 of the controller 3 is "H" level and the control signal output terminal P1 of the controller 3 is "L" level in a normal operation, the second transistor Q2 of the circuit for preventing simultaneous ON operations 6 turns ON accordingly. Thereby, the light emitting diode 2a of the semiconductor relay 2 is turned on a light, and the semiconductor switch element 2b is turned ON. The first transistor Q1 is OFF, and the first junction point J01 of the first resistor R1 and the light emitting diode 1a of the semiconductor relay 1 is connected through the fourth diode D4 and the second transistor Q2 with ground. Therefore, power supply to the light emitting diode 1a is cut off, so that the light emitting diode 1a turns OFF and the semiconductor switch element 1b is turned OFF.

At an abnormal condition when the control signal output terminals P1, P2 of the controller 3 are both "H" level by malfunction or stampede of the microcomputer, the both first and second transistors Q1, Q2 of the circuit for preventing simultaneous ON operations 6 turn ON. Thereby, the second junction point J02 of the second resistor R2 and the light emitting diode 2a of the semiconductor relay 2 is connected through the third diode D3 and the first transistor Q1 with ground. The first junction point J01 of the first resistor R1 and the light emitting diode 1a of the semiconductor relay 1 is connected through the fourth diode D4 and the second transistor Q2 with ground. Therefore, power supply to the light emitting diodes 1a and 2a is cut off, so that the light emitting diodes 1a, 2a turn OFF and the semiconductor switch elements 1b, 2b are turned OFF. Thus, simultaneous ON operations of the semiconductor switch elements 1b, 2b are prevented at the abnormal operation.

When the first and second transistors Q1, Q2 are simultaneously short-circuited between each collector and each emitter by simultaneous malfunction, the second junction point J02 of the second resistor R2 and the light emitting diode 2a of the semiconductor relay 2 is connected through the third diode D3 and the first transistor Q1 with ground, and the first junction point J01 of the first resistor R1 and the light emitting diode 1a of the semiconductor relay 1 is connected through the fourth diode D4 and the second transistor Q2 with ground. Therefore, power supply to the light emitting diodes 1a and 2a is cut off, so that the light emitting diodes 1a, 2a turn OFF and the semiconductor switch elements 1b, 2b are turned OFF. Thus, simultaneous ON operations of the semiconductor switch elements 1b, 2b are prevented.

According to the first embodiment of the present invention, a circuit for preventing simultaneous ON operations, which ON/OFF operations is securely acted and can prevent from turning drive outputs ON simultaneously even if the circuit for preventing simultaneous ON operations malfunctions, can be given. The circuit is built with discrete components, so that immunity against noise caused by static electricity can be improved. It will be low cost compared with a circuit by ICs.

Second Embodiment

Figure 3:
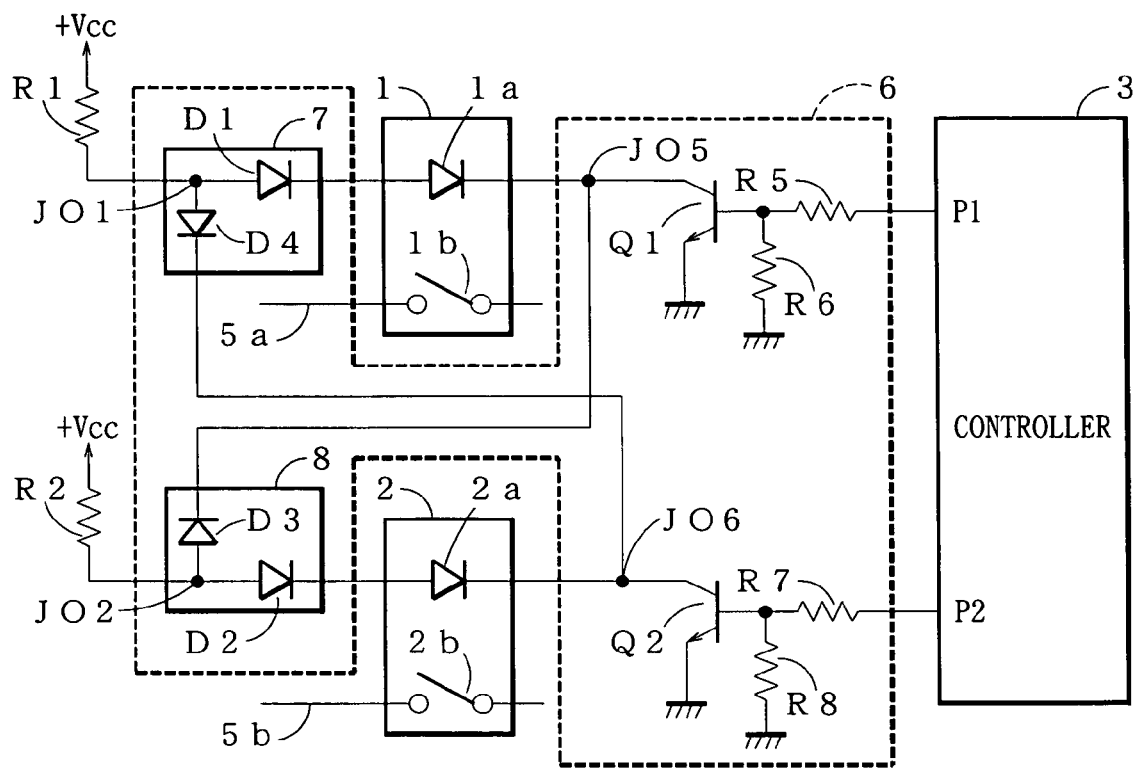
FIG. 3 is a circuit diagram of a circuit for preventing simultaneous ON operations at the relay drive apparatus of a second embodiment according to the present invention.
Figure 5:
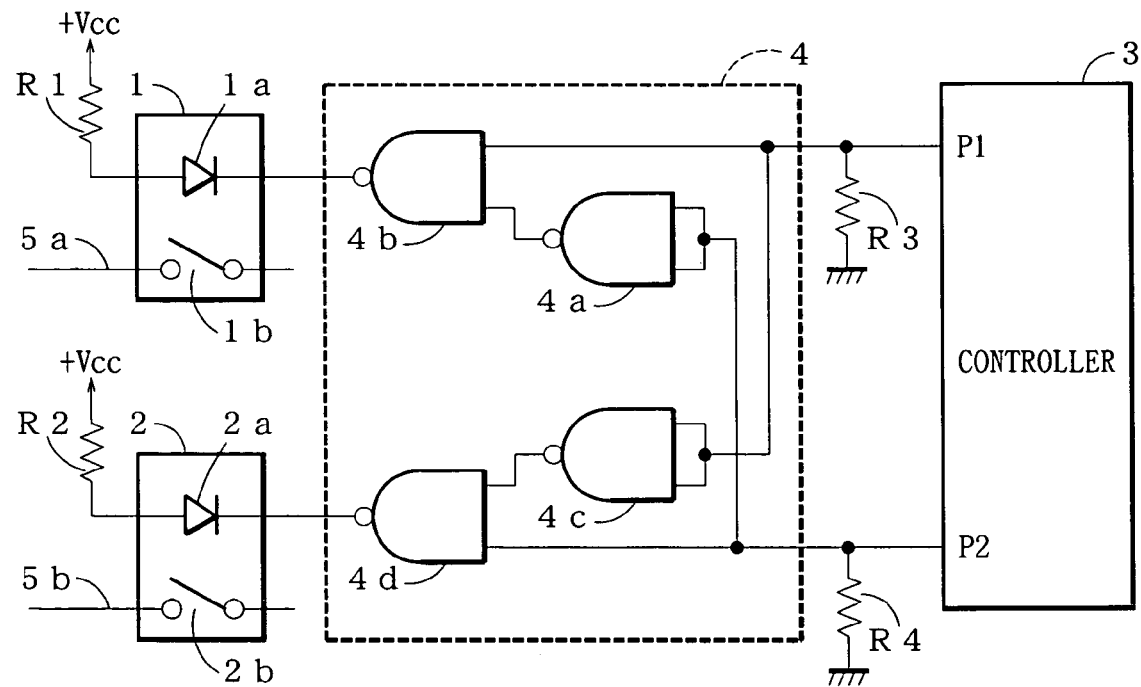
FIG. 5 is a circuit diagram of a circuit for preventing simultaneous ON operations at a relay drive apparatus by prior art.

FIG. 3 is a circuit diagram showing a structure of a circuit for preventing simultaneous ON operations at a relay drive apparatus according to a second embodiment of the present invention.

In FIG. 3, a semiconductor relay drive circuit includes a controller 3 having two semiconductor relays 1, 2 and a microcomputer for controlling ON/OFF operation of the semiconductor relays 1, 2. A circuit for preventing simultaneous ON operations 6 is connected between the semiconductor relays 1, 2 and control signal output terminals P1, P2 of the controller 3. The control signal output terminals P1, P2 output respectively control signals; one of those is "H" level and the other of those is "L" level.

The semiconductor relay 1 includes a photo-coupler having a light emitting diode 1a connected through a first resistor R1 with +Vcc power supply and a semiconductor switch element 1b structured by a MOS-FET turning ON/OFF to be controlled by an output from the photo-coupler. The semiconductor switch element 1b is connected with one signal line 5a of two signal lines 5a, 5b to be alternatively turned ON for danger by simultaneous ON operations.

Similarly, the semiconductor relay 2 includes a photo-coupler having a light emitting diode 2a connected through a second resistor R2 with +Vcc power supply and a semiconductor switch element 2b structured by a MOS-FET turning ON/OFF to be controlled by an output from the photo-coupler. The semiconductor switch element 2b is connected with the other signal line 5b of two signal lines 5a, 5b to be alternatively turned ON for danger by simultaneous ON operations.

The circuit for preventing simultaneous ON operations 6 includes the first and second transistors Q1, Q2, diodes D1-D4 and resistors R5-R8. The first transistor Q1 is an NPN transistor; a base of which is connected through the resistor R5 with the control signal output terminal P1 of the controller 3 and through the resistor R6 with ground; an emitter of which is grounded; and a collector of which is connected through a fifth junction point J05 of the light emitting diode 1a and the first transistor Q1 with the light emitting diode 1a and through the fifth junction point J05 and the third diode D3 with a second junction point J02 of the second resistor R2 and the light emitting diode 2a. The third diode D3 is connected in forward direction from the second junction point J02 of the second resistor R2 and the light emitting diode 2a to the collector of the first transistor Q1.

The first diode D1 is connected in forward direction from the first resistor R1 to the light emitting diode 1a.

The second transistor Q2 is an NPN transistor; a base of which is connected through the resistor R7 with the control signal output terminal P2 of the controller 3 and through the resistor R8 with ground; an emitter of which is grounded; and a collector of which is connected through a sixth junction point J06 of the light emitting diode 2a and the second transistor Q2 with the light emitting diode 2a and connected through the sixth junction point J06 and the fourth diode D4 with a first junction point J01 of the first resistor R1 and the light emitting diode 1a. The fourth diode D4 is connected in forward direction from the first junction point J01 of the first resistor R1 and the light emitting diode 1a to the collector of the second transistor Q2.

The second diode D2 is connected in forward direction from the second resistor R2 to the light emitting diode 2a. The second and third diodes D2, D3 to be packaged in a package 8 have the same characteristics. The first and fourth diodes D1, D4 to be packaged in a package 7 have the same characteristics.

In the above structure, when the control signal output terminal P1 of the controller 3 is "H" level and the control signal output terminal P2 of the controller 3 is "L" level in a normal operation, the first transistor Q1 of the circuit for preventing simultaneous ON operations 6 turns ON accordingly. Thereby, the light emitting diode 1a of the semiconductor relay 1 is turned on a light, and the semiconductor switch element 1b is turned ON. The second transistor Q2 is OFF, and the second junction point J02 of the second resistor R2 and the light emitting diode 2a is connected through the third diode D3 and the first transistor Q1 with ground. Therefore, power supply to the light emitting diode 2a is cut off, so that the light emitting diode 2a turns OFF and the semiconductor switch element 2b is turned OFF.

Oppositely, when the control signal output terminal P2 of the controller 3 is "H" level and the control signal output terminal P1 of the controller 3 is "L" level, the second transistor Q2 of the circuit for preventing simultaneous ON operations 6 turns ON accordingly. Thereby, the light emitting diode 2a of the semiconductor relay 2 is turned on a light, and the semiconductor switch element 2b is turned ON. The first transistor Q1 is OFF, and the first junction point J01 of the first resistor R1 and the light emitting diode 1a is connected through the fourth diode D4 and the second transistor Q2 with ground. Therefore, power supply to the light emitting diode 1a is cut off, so that the light emitting diode 1a turns OFF and the semiconductor switch element 1b is turned OFF.

At an abnormal condition when the control signal output terminals P1, P2 of the controller 3 are both "H" level by malfunction or stampede of the microcomputer, the both first and second transistors Q1, Q2 turn ON. Thereby, the second junction point J02 of the second resistor R2 and the light emitting diode 2a is connected through the third diode D3 and the first transistor Q1 with ground. The first junction point J01 of the first resistor R1 and the light emitting diode 1a is connected through the fourth diode D4 and the second transistor Q2 with ground. Therefore, power supply to the light emitting diodes 1a and 2a is cut off, so that the light emitting diodes 1a, 2a turn OFF and the semiconductor switch elements 1b, 2b are turned OFF. Thus, simultaneous ON operations of the semiconductor switch elements 1b, 2b are prevented at the abnormal operation.

When the first and second transistors Q1, Q2 are simultaneously short-circuited between each collector and each emitter by simultaneous malfunction, the second junction point J02 of the second resistor R2 and the light emitting diode 2a is connected through the third diode D3 and the first transistor Q1 with ground, and the first junction point J01 of the first resistor R1 and the light emitting diode 1a is connected through the fourth diode D4 and the second transistor Q2 with ground. Therefore, power supply to the light emitting diodes 1a and 2a is cut off, so that the light emitting diodes 1a, 2a turn OFF and the semiconductor switch elements 1b, 2b are turned OFF. Thus, simultaneous ON operations of the semiconductor switch elements 1b, 2b are prevented. The first and fourth diodes D1, D4 to be packaged in a package 7 have the same characteristics. The second and third diodes D2, D3 to be packaged in a package 8 have the same characteristics. Bad effects caused by dispersion of characteristics of diodes, such as an effect for an ON/OFF control voltage of the first and second transistors caused by dispersion of forward voltage drop of diodes, can be eliminated.

According to the second embodiment of the present invention, a circuit for preventing simultaneous ON operations, which ON/OFF operations is securely acted and can prevent from turning drive outputs ON simultaneously even if the circuit for preventing simultaneous ON operations malfunctions, can be given. The circuit is built with discrete components, so that immunity against noise caused by static electricity can be improved. It will be low cost compared with a circuit by ICs. Bad effects caused by dispersion of characteristics of diodes can be eliminated.

Third Embodiment

FIG. 4 is a circuit diagram showing a structure of a circuit for preventing simultaneous ON operations at a relay drive apparatus according to a third embodiment of the present invention.

In FIG. 4, a semiconductor relay drive circuit includes a controller 3 having two semiconductor relays 1, 2 and a microcomputer for controlling ON/OFF operation of the semiconductor relays 1, 2. A circuit for preventing simultaneous ON operations 6 is connected between the semiconductor relays 1, 2 and control signal output terminals P1, P2 of the controller 3. The control signal output terminals P1, P2 output respectively control signals; one of those is "H" level and the other of those is "L" level.

The semiconductor relay 1 includes a photo-coupler having a light emitting diode 1a connected through a first resistor R1 with +Vcc power supply and a semiconductor switch element 1b structured by a MOS-FET turning ON/OFF to be controlled by an output from the photo-coupler. The semiconductor switch element 1b is connected with one signal line 5a of two signal lines 5a, 5b to be alternatively turned ON for danger by simultaneous ON operations.

Similarly, the semiconductor relay 2 includes a photo-coupler having a light emitting diode 2a connected through a second resistor R2 with +Vcc power supply and a semiconductor switch element 2b structured by a MOS-FET turning ON/OFF to be controlled by an output from the photo-coupler. The semiconductor switch element 2b is connected with the other signal line 5b of two signal lines 5a, 5b to be alternatively turned ON for danger by simultaneous ON operations.

The circuit for preventing simultaneous ON operations 6 includes first, second and third transistors Q1, Q2, Q3, diodes D1-D4 and resistors R5-R11. The first transistor Q1 is an NPN transistor; a base of which is connected through the resistor R5 with the control signal output terminal P1 of the controller 3 and through the resistor R6 with ground; an emitter of which is grounded; and a collector of which is connected with the light emitting diode 1a.

The second transistor Q2 is an NPN transistor; a base of which is connected through the resistor R7 with the control signal output terminal P2 of the controller 3 and through the resistor R8 with ground; an emitter of which is grounded; and a collector of which is connected with the light emitting diode 2a.

The transistor Q3 is an NPN transistor; a base of which is connected through the resistor R9 and the third diode D3 with the control signal output terminal P1 of the controller 3, and connected through the resistor R9 and the fourth diode D4 with the control signal output terminal P2 of the controller 3, and through the resistor R10 with ground; an emitter of which is grounded; and a collector of which is connected through the first diode D1 with the first junction point J01 of the first resistor R1 and the light emitting diode 1a and connected through the second diode D2 with the second junction point J02 of the second resistor R2 and the light emitting diode 2a. +Vcc power supply is connected through the resistor R11 with a junction point of the resistor R9, and the third and fourth diodes D3, D4.

The third diode D3 is connected in forward direction from the resistor R9 to the control signal output terminal P1. The fourth diode D4 is connected in forward direction from the resistor R9 to the control signal output terminal P2. The first diode D1 is connected in forward direction from the first junction point J01 of the first resistor R1 and the light emitting diode 1a to the collector of the transistor Q3. The second diode D2 is connected in forward direction from the second junction point J02 of the second resistor R2 and the light emitting diode 2a to the collector of the transistor Q3. The first and second diodes D1, D2 to be packaged in a package 9 have the same characteristics. The third and fourth diodes D3, D4 to be packaged in a package 10 have the same characteristics.

In the above structure, when the control signal output terminal P1 of the controller 3 is "H" level and the control signal output terminal P2 of the controller 3 is "L" level in a normal operation, the first transistor Q1 of the circuit for preventing simultaneous ON operations 6 turns ON accordingly. Thereby, the light emitting diode 1a of the semiconductor relay 1 is turned on a light, and the semiconductor switch element 1b is turned ON. The second transistor Q2 is OFF, and the light emitting diode 2a is turned OFF. When the control signal output terminal P2 becomes "L" level in the above condition, the fourth diode D4 is in a conductive condition and the base of the transistor Q3 becomes "L" level. Therefore, the transistor Q3 is OFF.

Oppositely, when the control signal output terminal P2 of the controller 3 is "H" level and the control signal output terminal P1 of the controller 3 is "L" level, the second transistor Q2 of the circuit for preventing simultaneous ON operations 6 turns ON accordingly. Thereby, the light emitting diode 2a of the semiconductor relay 2 is turned on a light, and the semiconductor switch element 2b is turned ON. Since the first transistor Q1 is OFF, the light emitting diode 1a is turned OFF, and the semiconductor switch element 1b is turned OFF. When the control signal output terminal P1 becomes "L" level in the above condition, the third diode D3 is in a conductive condition, and the base of the transistor Q3 becomes "L" level. Therefore, the transistor Q3 is OFF.

At an abnormal condition when the control signal output terminals P1, P2 of the controller 3 are both "H" level by malfunction or stampede of the microcomputer, the both first and second transistors Q1, Q2 turn ON. Thereby, the third and fourth diodes D3, D4 are not in a conductive condition and the base of the transistor Q3 is supplied with "H" level voltage through the resistors R9, R11 from the +Vcc power supply, so that the transistor Q3 turns ON. Therefore, the first junction point J01 of the first resistor R1 and the light emitting diode 1a is connected through the first diode D1 and the third transistor Q3 with ground, and the second junction point J02 of the second resistor R2 and the light emitting diode 2a is connected through the second diode D2 and the transistor Q3 with ground. Thereby, power supply to the light emitting diodes 1a and 2a is cut off, so that the light emitting diodes 1a, 2a turn OFF and the semiconductor switch elements 1b, 2b are turned OFF. Thus, simultaneous ON operations of the semiconductor switch elements 1b, 2b are prevented at the abnormal operation.

The first and second diodes D1, D2 to be packaged in a package 9 have the same characteristics. The third and fourth diodes D3, D4 to be packaged in a package 10 have the same characteristics. Bad effects caused by dispersion of characteristics of diodes, such as an effect for an ON/OFF control voltage of the first and second transistors caused by dispersion of forward voltage drop of diodes, can be eliminated.

According to the third embodiment of the present invention, a circuit for preventing simultaneous ON operations, which ON/OFF operations is securely acted and can prevent from turning drive outputs ON simultaneously even if the circuit for preventing simultaneous ON operations malfunctions, can be given. The circuit is built with discrete components, so that immunity against noise caused by static electricity can be improved. It will be low cost compared with a circuit by ICs.

Although the present invention has been fully described by way of embodiments, it is to be noted that various change and modifications can be made with the scope of the present invention as defined by the following claims.

For example, instead of semiconductor relays used in the above embodiments, normal relays having an magnetizing coil and contact switches can be used.

Although the present invention has been fully described by way of examples with reference to the accompanying drawings, it is to be noted that various change and modifications can be made with the scope of the present invention as defined by the following claims.

What is claimed is:

1. A circuit for preventing simultaneous ON operations at a relay drive apparatus, which includes a first relay having a first drive unit receiving drive current through a first resistor from a power supply and a first switch device connected with a first signal line to be driven by the first drive unit, a second relay having a second drive unit receiving drive current through a second resistor from said power supply and a second switch device connected with a second signal line to be driven by the second drive unit, and a controller having a first control signal output terminal for outputting a control signal to control the first drive unit and a second control signal output terminal for outputting a control signal to control the second drive unit, comprising:

a first diode;
a second diode;
a first transistor being connected through the first diode with the first drive unit for controlling ON/OFF operation by the control signal derived from the first control signal output terminal of the controller;
a second transistor being connected through the second diode with the second drive unit for controlling ON/OFF operation by the control signal derived from the second control signal output terminal of the controller;
a first junction point of the first resistor and the first drive unit;
a second junction point of the second resistor and the second drive unit;
a third junction point of the first diode and the first transistor;
a fourth junction point of the second diode and the second transistor;
a third diode, an anode of which is connected to the second junction point, a cathode of which is connected to the third junction point; and
a fourth diode, an anode of which is connected to the first junction point, a cathode of which is connected to the fourth junction point.

2. A circuit for preventing simultaneous ON operations at a relay drive apparatus, which includes a first relay having a first drive unit receiving drive current through a first resistor from a power supply and a first switch device connected with a first signal line to be driven by the first drive unit, a second relay having a second drive unit receiving drive current through a second resistor from said power supply and a second switch device connected with a second signal line to be driven by the second drive unit, and a controller having a first control signal output terminal for outputting a control signal to control the first drive unit and a second control signal output terminal for outputting a control signal to control the second drive unit, comprising:

a first diode being connected between the first resistor and the first drive unit;
a second diode being connected between the second resistor and the second drive unit;
a first transistor being connected with the first drive unit for controlling ON/OFF operation by the control signal derived from the first control signal output terminal of the controller;
a second transistor being connected with the second drive unit for controlling ON/OFF operation by the control signal derived from the second control signal output terminal of the controller;
a first junction point of the first resistor and the first drive unit;
a second junction point of the second resistor and the second drive unit;
a fifth junction point of the first drive unit and the first transistor;
a sixth junction point of the second drive unit and the second transistor;
a third diode, an anode of which is connected to the second junction point, a cathode of which is connected to the fifth junction point; and
a fourth diode, an anode of which is connected to the first junction point and a cathode of which is connected to the sixth junction point.

3. The circuit for preventing simultaneous ON operations according to claim 2, wherein the first diode and the fourth diode have a same characteristic, and the second diode and the third diode have a same characteristic.

4. A circuit for preventing simultaneous ON operations at a relay drive apparatus, which includes a first relay having a first drive unit receiving drive current through a first resistor from a power supply and a first switch device connected with a first signal line to be driven by the first drive unit, a second relay having a second drive unit receiving drive current through a second resistor from said power supply and a second switch device connected with a second signal line to be driven by the second drive unit, and a controller having a first control signal output terminal for outputting a control signal to control the first drive unit and a second control signal output terminal for outputting a control signal to control the second drive unit, comprising:

a first diode;

a second diode;

a first transistor being connected with the first drive unit for controlling ON/OFF operation by the control signal derived from the first control signal output terminal of the controller;

a second transistor being connected with the second drive unit for controlling ON/OFF operation by the control signal derived from the second control signal output terminal of the controller;

a first junction point of the first resistor and the first drive unit;

a second junction point of the second resistor and the second drive unit;

a third transistor being connected through the first diode with the first junction point and through the second diode with the second junction point;

a third diode being connected between the first control signal output terminal and the third transistor; and a fourth diode being connected between the second control signal output terminal and the third transistor.

* * * * *